(12) United States Patent
Han et al.

(10) Patent No.: US 11,594,543 B2
(45) Date of Patent: Feb. 28, 2023

(54) SEMICONDUCTOR STORAGE DEVICE

(71) Applicant: Kioxia Corporation, Tokyo (JP)

(72) Inventors: Yefei Han, Yokkaichi Mie (JP); Weili Cai, Yokkaichi Mie (JP); Naoya Yoshimura, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 232 days.

(21) Appl. No.: 17/018,682

(22) Filed: Sep. 11, 2020

(65) Prior Publication Data
US 2021/0296338 A1 Sep. 23, 2021

(30) Foreign Application Priority Data

Mar. 23, 2020 (JP) .............................. JP2020-051387

(51) Int. Cl.
| | |
|---|---|
| H01L 27/11556 | (2017.01) |
| G11C 5/06 | (2006.01) |
| G11C 5/02 | (2006.01) |
| H01L 27/11519 | (2017.01) |
| H01L 27/11565 | (2017.01) |
| H01L 27/11582 | (2017.01) |

(52) U.S. Cl.
CPC ........ *H01L 27/11556* (2013.01); *G11C 5/025* (2013.01); *G11C 5/06* (2013.01); *H01L 27/11519* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,425,207 | B2 | 8/2016 | Yasuda |
| 10,068,914 | B2 | 9/2018 | Jiang |
| 2016/0071866 | A1 | 3/2016 | Shimojo |
| 2017/0062456 | A1 | 3/2017 | Sugino |
| 2018/0240812 | A1 | 8/2018 | Barbato |
| 2019/0259774 | A1 | 8/2019 | Murakoshi et al. |
| 2020/0013791 | A1 | 1/2020 | Or-Bach et al. |

FOREIGN PATENT DOCUMENTS

| | | |
|---|---|---|
| JP | 2016-054271 A | 4/2016 |
| JP | 2017-050527 A | 3/2017 |
| TW | 201935662 A | 9/2019 |

*Primary Examiner* — Sarah K Salerno
(74) *Attorney, Agent, or Firm* — Foley & Lardner LLP

(57) ABSTRACT

According to one embodiment, a semiconductor storage device includes a semiconductor pillar including a channel. The channel includes a first channel portion and a second channel portion. A virtual cross section intersecting a first direction and including a first interconnection, a first electrode, the semiconductor pillar, a second electrode, and a second interconnection is determined. Both first end portions of the first channel portion and a first midpoint between both the first end portions are determined in the virtual cross section. Both second end portions of the second channel portion and a second midpoint between both the second end portions are determined in the virtual cross section. In this case, an angle between a second direction and a center line connecting the first midpoint and the second midpoint is an acute angle.

6 Claims, 7 Drawing Sheets

SEMICONDUCTOR STORAGE DEVICE

CROSS-REFERENCE TO RELATED APPLICATION

This application is based upon and claims the benefit of priority from Japanese Patent Application No. 2020-051387, filed Mar. 23, 2020; the entire contents of which are incorporated herein by reference.

FIELD

Embodiments described herein relate generally to a semiconductor storage device.

BACKGROUND

A semiconductor storage device has been proposed which includes: a laminate including insulating films and word lines which are alternately laminated; and semiconductor pillars which penetrate through the laminate. A semiconductor storage device has been known which has an opposed cell structure in which floating gate electrodes are disposed at both sides of the semiconductor pillar with a tunnel insulating film interposed therebetween. In the semiconductor storage device having the opposed cell structure, a structure has been known in which channels of the opposed cells are connected to each other. In this kind of semiconductor storage device, there is a problem in that, as miniaturization of the cell size advances, capacitance between the opposed cells increases, interference between the opposed cells significantly occurs.

DETAILED DESCRIPTION

Figure 1:
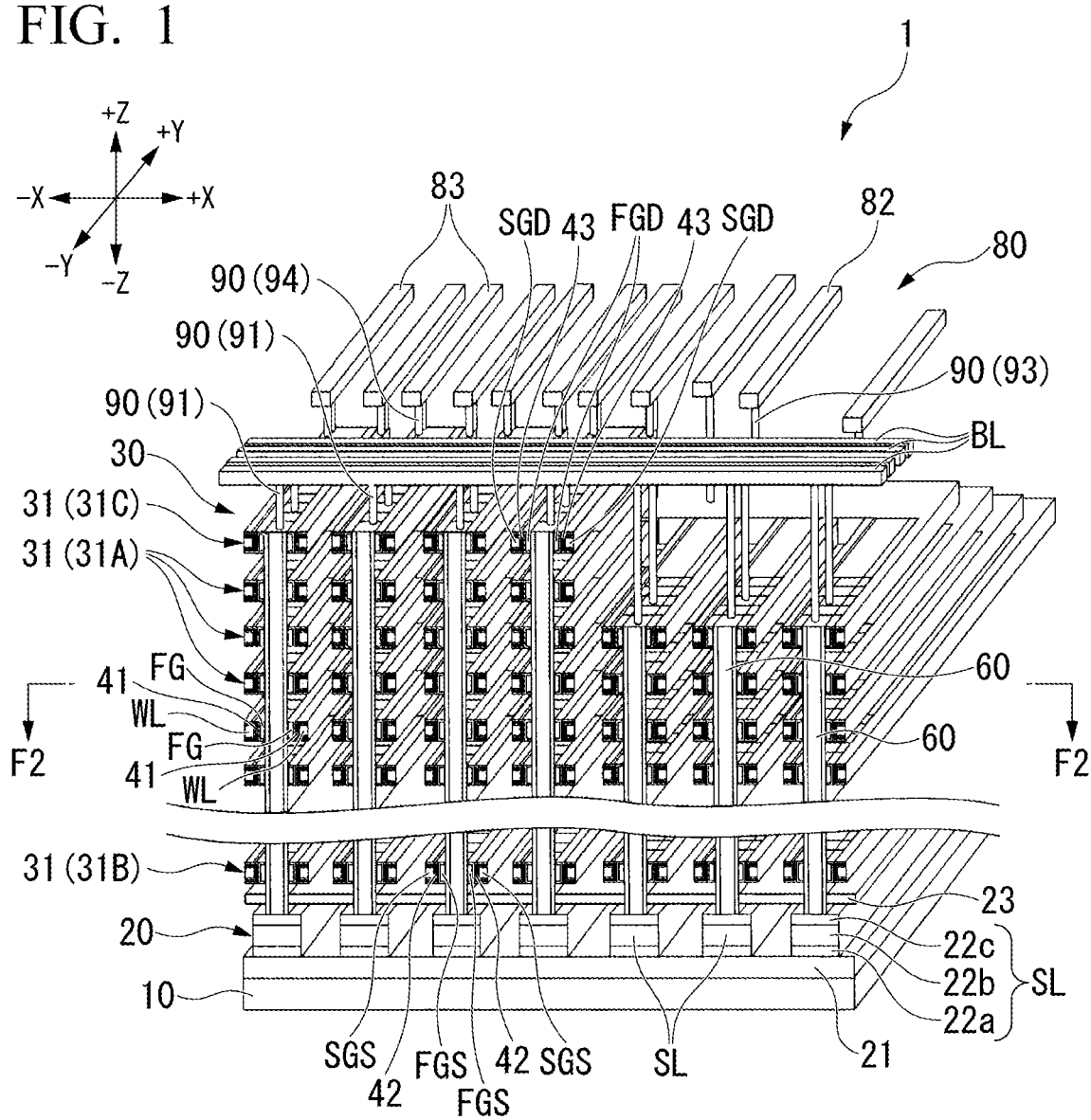
FIG. 1 is a perspective view showing an overall structure of a semiconductor storage device according to a first embodiment.

According to one embodiment, a semiconductor storage device includes a plurality of semiconductor pillars, a first interconnection, a second interconnection, a first electrode, a second electrode, a first insulating film, and a second insulating film. The plurality of semiconductor pillars extend in a first direction and are spaced apart at a distance in a second direction intersecting the first direction with a first insulator interposed therebetween, and each semiconductor pillar includes a channel. The first interconnection extends in the second direction and is disposed to face the semiconductor pillar. The second interconnection extends in the second direction, is disposed to face the semiconductor pillar, and is spaced apart from the first interconnection in a third direction intersecting the first direction and the second direction. The first electrode is disposed between the channel and the first interconnection. The second electrode is disposed between the channel and the second interconnection. The first insulating film is disposed between the first electrode and the first interconnection. The second insulating film is disposed between the second electrode and the second interconnection. The semiconductor pillar includes a second insulator. The channel includes a first channel portion, a second channel portion, and a connection channel portion disposed around the second insulator. The first channel portion is provided between the first electrode and the second insulator. The second channel portion is provided between the second electrode and the second insulator. The first channel portion and the second channel portion are connected via the connection channel portion to surround the second insulator. Here, a virtual cross section intersecting the first direction and including the first interconnection, the first electrode, the semiconductor pillar, the second electrode, and the second interconnection is determined. Both first end portions of the first channel portion and a first midpoint between both the first end portions are determined in the virtual cross section. Both second end portions of the second channel portion and a second midpoint between both the second end portions are determined in the virtual cross section. In this case, an angle between the second direction and a center line connecting the first midpoint and the second midpoint is an acute angle.

Hereinafter, semiconductor storage devices according to the embodiments will be described with reference to the drawings. In the following description, the same reference signs are given to components having the same or similar function. Duplicate description of these components may be omitted. In this specification, "connect" is not limited to a case of physical connection, and also includes a case of electrical connection. In this specification, "adjacent to" is not limited to a case where members are in contact with each other, and also includes a case where another member is interposed between two members serving as an object. In this specification, "XX is provided above YY" is not limited to a case where XX is in contact with YY, and also includes a case where another member is interposed between XX and YY. In this specification, "ring shape" and "annulation shape" are not limited to a circular ring shape, and also includes a rectangular ring shape. In this specification, "arc shape" broadly means a shape similar to a circular arc in a macroscopic view, "bow shape" broadly means a shape similar to a bow shape in a macroscopic view, and the meanings thereof may include portions that are located at the middle or the end of each of the shapes and that have curvature different from each other or extend straight. In this specification, "parallel" and "orthogonal" may include the meanings of "substantially parallel" and "substantially orthogonal", respectively.

Furthermore, a +X direction, a −X direction, a +Y direction, a −Y direction, a +Z direction, and a −Z direction will be defined in advance. The +X direction, the −X direction, the +Y direction, and the −Y direction are directions that are parallel to a surface of a silicon substrate 10 (to be described below). The +X direction is a direction in which bit lines BL (to be described below) extend. The −X direction is a direction opposite to the +X direction. When the +X direction and the −X direction are not distinguished, they are referred to simply as "X direction." The +Y direction and the −Y direction are directions that intersect (e.g., are substantially orthogonal to) the X direction. The +Y direction is a direction in which word lines WL (to be described below) extend. The −Y direction is a direction opposite to the +Y direction. When the +Y direction and the −Y direction are not distinguished, they are referred to simply as "Y direction." The +Z direction and the −Z direction are directions that intersect (e.g., are substantially orthogonal to) the X direction and the Y direction, and are a thickness direction of the silicon substrate 10. The +Z direction is a direction that is directed to a laminate 30 (to be described below) from the silicon substrate 10. The −Z direction is a direction opposite to the +Z direction. When the +Z direction and the −Z direction are not distinguished, they are referred to simply as "Z direction." In this specification, the "+Z direction" may be referred to "up," and the "−Z direction" may be referred to "down." However, these expressions are for the sake of convenience, and do not regulate a gravitational direction. The +Z direction is an example of the "first direction." The +Y direction is an example of the "second direction." The +X direction is an example of the "third direction."

First Embodiment

<1. Entire Configuration of Semiconductor Storage Device>

Firstly, an entire configuration of a semiconductor storage device 1 according to a first embodiment will be described. The semiconductor storage device 1 is a non-volatile semiconductor storage device, for example, a NAND type flash memory.

FIG. 1 is a perspective view showing a constitution of a semiconductor storage device 1. The semiconductor storage device 1 includes, for example, the silicon substrate 10, lower structure 20, the laminate 30, a plurality of semiconductor pillars (pillar-shaped member) 60, an insulating-dividing portion 70 (refer to FIG. 2), an upper structure 80, and a plurality of contacts 90. Note that, FIG. 1 schematically shows the semiconductor pillar 60 formed in a quadrangular pillar shape; however, the semiconductor pillar 60 according to the embodiment is formed in a substantially oval shape extending in a diagonal direction along cross section including the XY directions as particularly described below with reference to FIG. 2.

The silicon substrate 10 is a substrate that is a base of the semiconductor storage device 1. At least part of the silicon substrate 10 is formed in a plate shape extending in the X direction and the Y direction. The silicon substrate 10 is formed of, for example, a semiconductor material including silicon (Si). The silicon substrate 10 is an example of "substrate".

The lower structure 20 is provided above the silicon substrate 10. The lower structure 20 includes, for example, a lower insulating film 21, a plurality of source lines SL, and an upper insulating film 23. The lower insulating film 21 is provided above the silicon substrate 10. The plurality of source lines SL are provided above the lower insulating film 21. The plurality of source lines SL are adjacent to one another in the X direction (third direction), and each extend in the Y direction (second direction). Each of the source lines SL include, for example, a conductive layer 22a provided above the lower insulating film 21, an interconnection layer 22b provided above the conductive layer 22a, and a conductive layer 22c provided above the interconnection layer 22b. The upper insulating film 23 is provided above the plurality of source lines SL. Insulating members which are not shown in the drawings are provided between the source line SL and the upper insulating film 23 and between the lower insulating film 21 and the upper insulating film 23.

The laminate 30 is provided above the lower structure 20. The laminate 30 includes, for example, a plurality of functional layers 31 and a plurality of insulating films (interlayer insulating film) 32 (refer to FIG. 3). The plurality of functional layers 31 and the plurality of interlayer insulating films 32 (refer to FIGS. 4 and 5) are alternately laminated one by one in the Z direction (first direction). The plurality of functional layers 31 include a plurality of first functional layers 31A, one or more second functional layers 31B, and one or more third functional layers 31C.

Each of the first functional layers 31A includes, for example, a plurality of word lines WL, a plurality of floating gate electrodes FG, and a plurality of block insulating films 41 (first insulating film and second insulating film). The word lines WL are interconnections that are provided at the sides of the semiconductor pillars 60. The word lines WL included in one of the first functional layers 31A are adjacent to one another in the X direction (second direction), and each extend in the Y direction (third direction). In a case where the word lines WL inject electrons into the floating gate electrodes FG described below, the word lines WL take the electrons injected into the floating gate electrodes FG from the floating gate electrodes FG, or the like, voltages are applied by a drive circuit (not shown in the drawings), and predetermined voltages are applied to the floating gate electrodes FG connected to the word lines WL.

Each of the floating gate electrodes FG is an insulating film or an electrode film which is provided at the side of the semiconductor pillars 60. The floating gate electrodes FG are films that have a capacity to store electric charge. The floating gate electrodes FG change a stored state of electrons in a case where voltages are applied by the word lines WL. Each floating gate electrode FG is provided between the word line WL corresponding to the floating gate electrode FG and the semiconductor pillar 60 corresponding to the floating gate electrode FG. In this specification, "corresponding to" means that parts corresponding to each other are combined and therefore form an element constituting one memory cell (memory cell structure).

Each of the block insulating films (first insulating film and second insulating film) 41 is provided between the word line WL corresponding to the block insulating film 41 and the floating gate electrode FG corresponding to the block insulating film 41. Note that, a configuration of the first functional layer 31A will be described in detail later.

The second functional layer 31B is provided below the plurality of first functional layers 31A. The second functional layer 31B includes, for example, a plurality of source-side select gate lines SGS, a plurality of source-side select gate electrodes FGS, and a plurality of block insulating films 42. The plurality of source-side select gate lines SGS are adjacent to one another in the X direction, and each extend in the Y direction. Each of the source-side select gate electrodes FGS is provided between the source-side select gate line SGS corresponding to the source-side select gate electrode FGS and the semiconductor pillar 60 corresponding to the source-side select gate electrode FGS. Each of the block insulating films 42 is provided between the source-side select gate line SGS corresponding to the block insulating film 42 and the source-side select gate electrode FGS corresponding to the block insulating film 42. In a case where the source-side select gate lines SGS perform conduction between the semiconductor pillars 60 and the source lines SL, a voltage is applied thereto by the drive circuit (not shown in the drawings), and a predetermined voltage is applied to the source-side select gate electrode FGS connected to the source-side select gate line SGS.

The third functional layers 31C are provided above the plurality of first functional layers 31A. The third functional layer 31C includes, for example, a plurality of drain-side select gate lines SGD, a plurality of drain-side select gate electrodes FGD, and a plurality of block insulating films 43. The plurality of drain-side select gate lines SGD are adjacent to one another in the X direction, and each extend in the Y direction. Each of the drain-side select gate electrodes FGD is provided between the word lines WL corresponding to the drain-side select gate electrode FGD and the semiconductor pillar 60 corresponding to the drain-side select gate electrode FGD. Each of the block insulating films 43 is provided between the drain-side select gate line SGD corresponding to the block insulating film 43 and the drain-side select gate electrode FGD corresponding to the block insulating film 43. The plurality of drain-side select gate lines SGD perform conduction between the semiconductor pillars 60 and the source lines SL, a voltage is applied thereto by the drive circuit (not shown in the drawings), and a predetermined voltage is applied to the drain-side select gate electrode FGD connected to the drain-side select gate line SGD.

The plurality of semiconductor pillars 60 are provided above the plurality of source lines SL, and each extend in the Z direction (first direction). The plurality of semiconductor pillars 60 are provided away from one another in the Y direction (second direction) and the X direction (third direction). For example, when viewed in the Z direction, the plurality of semiconductor pillars 60 are arranged in a matrix in the X direction and the Y direction. A lower end of each semiconductor pillar 60 penetrates through the upper insulating film 23 of the lower structure 20 and is connected to the source line SL. Note that, a configuration of the semiconductor pillar 60 and a configuration of the insulating-dividing portion 70 will be described in detail later.

The upper structure 80 is provided above the laminate 30. The upper structure 80 includes, for example, a plurality of bit lines BL, interconnections used for the source-side select gate lines SGS (not shown in the drawings), interconnections 82 used for the word lines WL, and interconnections 83 used for the drain-side select gate lines SGD. Each of the contacts 90 extends in the Z direction (first direction). The plurality of contact 90 include, for example, a plurality of contacts 91 used for the semiconductor pillars 60, a plurality of contacts (not shown in the drawings) used for the source-side select gate line SGS, a plurality of contacts 93 used for the word lines WL, and a plurality of contacts 94 used for the drain-side select gate lines SGD.

The contacts 91 are provided above the semiconductor pillars 60. The bit lines BL are adjacent to one another in the Y direction (second direction), and each extend in the X direction (third direction). In a case where the semiconductor pillar 60 provided on the outermost side in the −X direction among the plurality of semiconductor pillars 60 arranged in the X direction is set to a first pillar, the odd-numbered semiconductor pillars 60 are connected to common bit lines BL via the contacts 91. The even-numbered semiconductor pillars 60 are connected to common bit lines BL different from the bit lines BLA via the contacts 91. That is, the semiconductor pillars 60 that are adjacent to each other among the plurality of semiconductor pillars 60 arranged in the X direction are not connected to the same bit line BL.

A plurality of contacts (not shown in the drawings) are provided above ends of the source-side select gate lines SGS in the +Y direction. Interconnections (not shown in the drawings) extending in the Y direction are provided above the contacts. The interconnections which are not shown in the drawings are connected to the source-side select gate lines SGS via contacts which are not shown in the drawings.

The plurality of contacts 93 are provided above ends of the word lines WL in the Y direction. The interconnections 82 are provided above the contacts 93 and each extend in the Y direction. The interconnections 82 are connected to the word lines WL via the contacts 93.

The plurality of contacts 94 are provided above ends of the drain-side select gate lines SGD in the +Y direction. The interconnections 83 are provided above the contacts 94 and each extend in the Y direction. The interconnections 83 are connected to the drain-side select gate lines SGD via the contacts 94.

<2. Configuration of Laminate>

Figure 2:
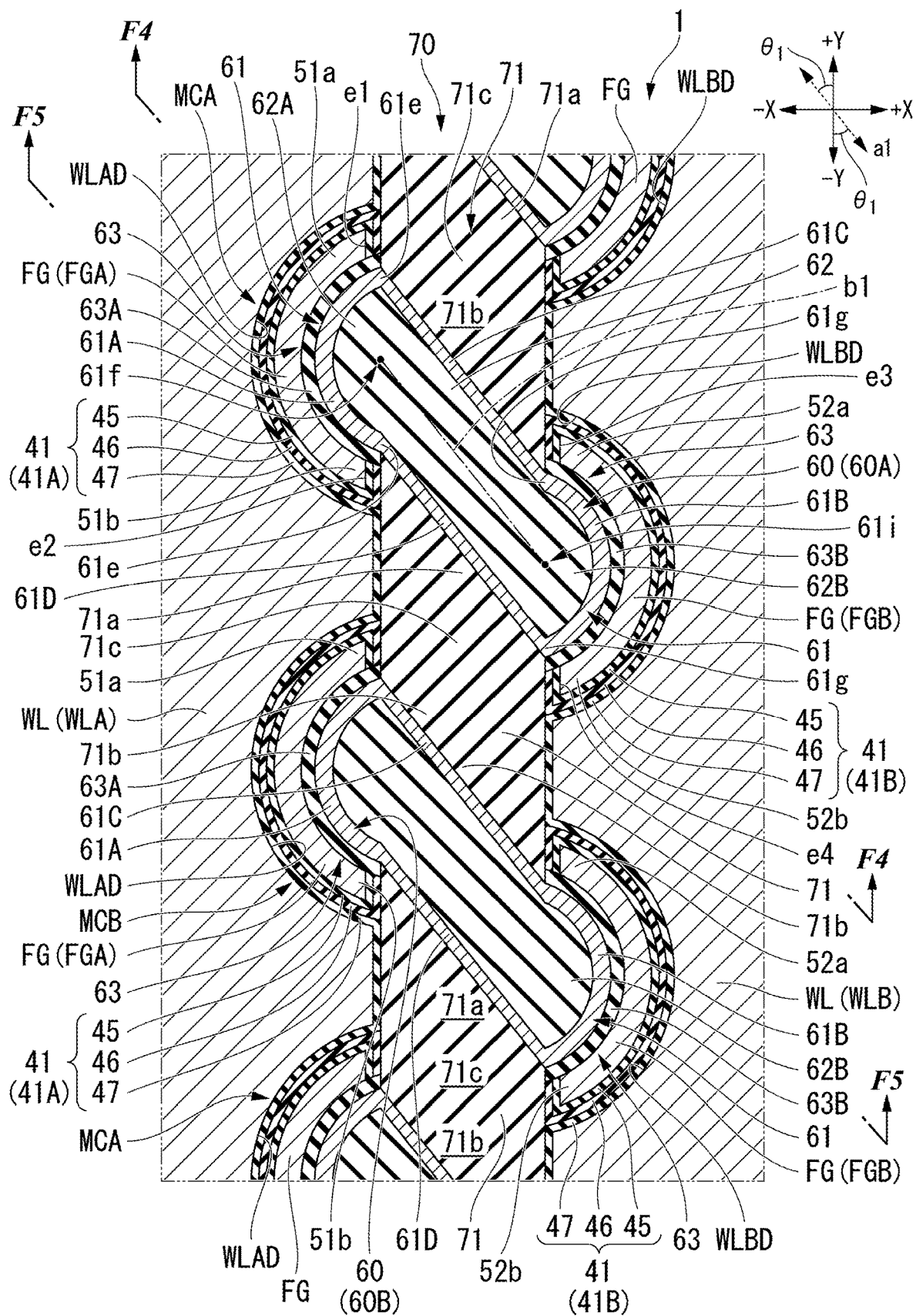
FIG. 2 is a cross-sectional view showing a laminate taken along a line F2-F2 shown in FIG. 1.
Figure 4:
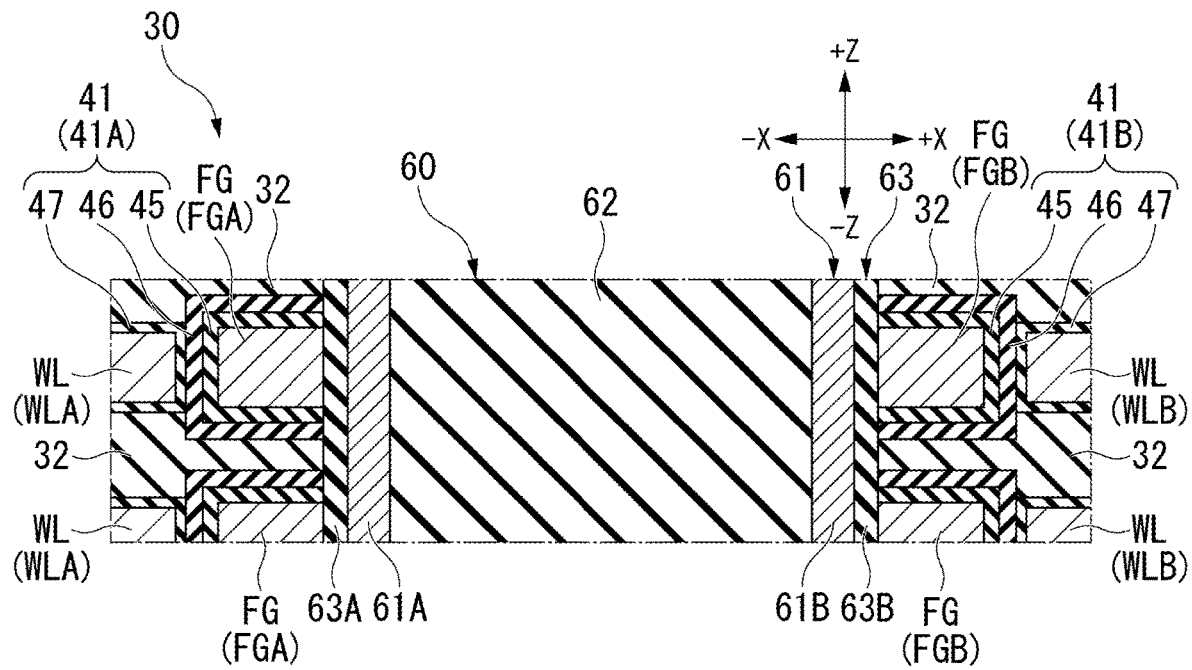
FIG. 4 is a cross-sectional view showing a laminate taken along a line F4-F4 shown in FIG. 2.
Figure 5:
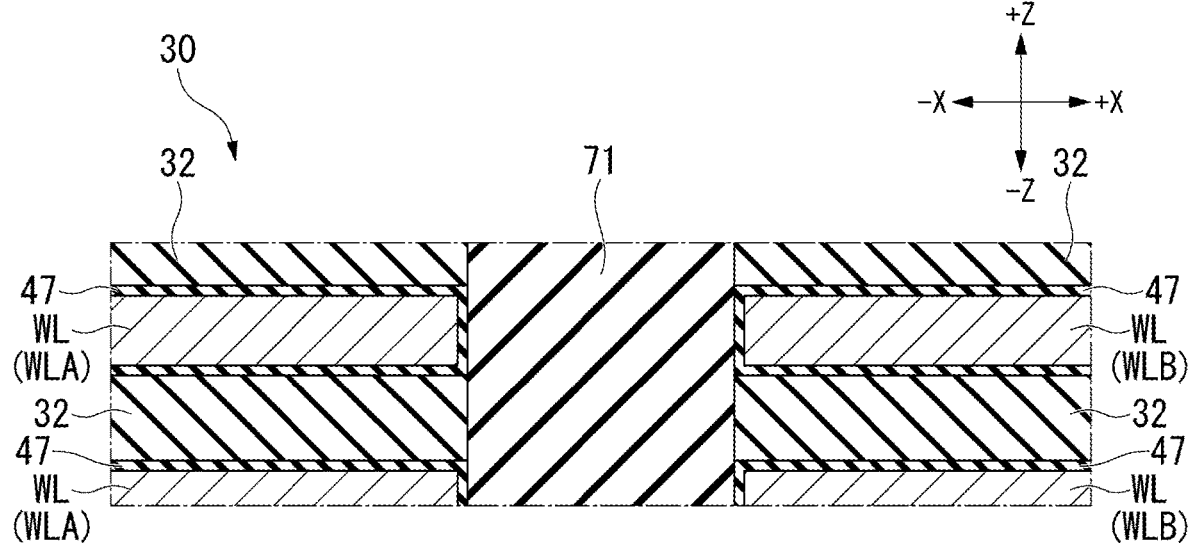
FIG. 5 is a cross-sectional view showing a laminate taken along a line F5-F5 shown in FIG. 2.

Next, a configuration of the laminate 30 will be described in detail. FIG. 2 is a cross-sectional view showing the laminate 30 taken along a line F2-F2 of shown in FIG. 1. FIG. 4 is a cross-sectional view showing the laminate 30 taken along a line F4-F4 shown in FIG. 2, and FIG. 5 is a cross-sectional view showing the laminate 30 taken along a line F5-F5 shown in FIG. 2.

The laminate 30 has a storage structure around each semiconductor pillar 60 which can store information. The storage structures, each of which is provided around the semiconductor pillar 60, have the same structure as each other. Consequently, in the following explanation, two semiconductor pillars 60 (first semiconductor pillar 60A and second semiconductor pillar 60B) are focused, and the configuration around the semiconductor pillars 60A and 60B will be mainly described.

<2.1 Word Line>

Firstly, the word lines WL will be described. As shown in FIG. 2, the plurality of word lines WL include: first word lines WLA located on the sides of the semiconductor pillars 60 in the −X direction; and second word lines WLB located on the sides of the semiconductor pillars 60 in the +X direction. The first word lines WLA and the second word lines WLB are adjacent to one another in the X direction, and each extend in the Y direction. The first word lines WLA and the second word lines WLB are led out, for example, in directions opposite to each other in the Y direction, and are controlled independently of each other. The first word lines WLA is an example of "first interconnection". The second word lines WLB is an example of "second interconnection".

The word lines WL is formed of, for example, tungsten. A barrier metal film (not shown in the drawings) that curbs diffusion of a material of the word lines WL may be provided on surfaces of the word lines WL. A barrier metal film is formed of, for example, titanium nitride (TiN). Additionally, a blocking film may be formed on a surface of the barrier metal film. The blocking film is formed of, for example, AlO.

<2.2 Floating Gate Electrode>

Next, the floating gate electrode FG will be described. As shown in FIG. 2, the plurality of floating gate electrodes FG include: first floating gate electrodes (first electrode) FGA located on the sides of the ends of the semiconductor pillars 60 in the −X direction; and second floating gate electrodes (second electrode) FGB located on the sides of the ends of the semiconductor pillars 60 in the +X direction. The first floating gate electrode FGA is provided between the first word line WLA and the side of the end of the semiconductor pillar 60 in the −X direction (moreover, refer to the portion between the first word line WLA and a first channel portion 61A of the semiconductor pillar 60 which will be described later). On the other hand, the second floating gate electrode FGB is provided between the second word line WLB and the side of the end of the semiconductor pillar 60 in the +X direction (moreover, refer to the portion between the second word lines WLB and a second channel portion 61B of the semiconductor pillar 60 which will be described later). The first floating gate electrode FGA is an example of "first charge storage part". The second floating gate electrode FGB is an example of "second charge storage part".

The floating gate electrodes FG are formed of, for example, polysilicon. The first floating gate electrodes FGA change a stored state of electrons in a case where voltages are applied by the first word lines WLA. The second floating gate electrodes FGB change a stored state of electrons in a case where voltages are applied by the second word lines WLB.

As shown in FIG. 2, the first floating gate electrodes FGA each include, for example, a first portion (first curve portion) 51a and a second portion (second curve portion) 51b. In the Y direction, the first portion 51a is located closer to the side in the +Y direction than to a center portion of the first floating gate electrode FGA. The first portion 51a protrudes in the +Y direction from an end of the first channel portion 61A in the +Y direction which will be described later. On the other hand, in the Y direction, the second portion 51b is located closer to the side in the —Y direction than to the center portion of the first floating gate electrode FGA. The second portion 51b protrudes in the —Y direction from the end of the first channel portion 61A in the —Y direction which will be described later.

Note that, the projected circular arc shape in a cross-sectional view such as the first channel portion 61A is only an example of the embodiment. The portion at which the first channel portion 61A is in contact with a first tunnel insulating film 63A that will be described later may be formed in a straight shape in a cross-sectional view.

In the embodiment, the first floating gate electrodes FGA are each formed in an arc shape that has a center angle of, for example, approximately 180°. In the embodiment, the first portion 51a is formed in a circular arc shape that becomes close to a first insulator 71 which will be described later in the direction from the center portion in the Y direction of the first floating gate electrode FGA to the side in the +Y direction. The first portion 51a includes a portion that is located closer to the side in the +X direction than to the side of the first channel portion 61A in the +X direction. The first portion 51a has a first edge e1 adjacent to the first insulator 71 in the X direction. "adjacent to a first insulator" means that the first portion 51a is closest to the first insulator 71 in the portions constituting the first portion 51a. This definition is similarly applied to the second portion 51b of the first floating gate electrode FGA and the second floating gate electrode FGB.

On the other hand, the second portion 51b is formed in a circular arc shape that becomes close to the first insulator 71 in the direction from the center portion in the Y direction of the first floating gate electrode FGA to the side in the —Y direction. The second portion 51b includes a portion that is located closer to the side in the −X direction than to the side of the first channel portion 61A in the −X direction. The second portion 51b has a second edge e2 adjacent to the first insulator 71 in the X direction. Note that, the first portion Ma and the second portion 51b may be directly connected to each other, and a straight portion extending in the Y direction may be provided between the first portion 51a and the second portion 51b.

Similarly, the second floating gate electrodes FGB each include, for example, a first portion (first curve portion) 52a and a second portion (second curve portion) 52b. In the Y direction, the first portion 52a is located closer to the side in the +Y direction than to a center portion of the second floating gate electrode FGB. The first portion 52a protrudes in the +Y direction from an end of the second channel portion 61B in the +Y direction. On the other hand, in the Y direction, the second portion 52b is located closer to the side (second side) in the —Y direction than to the center portion of the first floating gate electrode FGA. The second portion 52b protrudes in the —Y direction from the end of the second channel portion 61B in the —Y direction.

Note that, the projected circular arc shape in a cross-sectional view such as the second channel portion 61B is only an example of the embodiment. The portion at which the second channel portion 61B is in contact with a second tunnel insulating film 63B that will be described later may be formed in a straight shape in a cross-sectional view.

In the embodiment, the second floating gate electrodes FGB are each formed in an arc shape that has a center angle of, for example, approximately 180°. In the embodiment, the first portion 52a is formed in a circular arc shape that becomes close to the first insulator 71 which will be described later in the direction from the center portion in the Y direction of the second floating gate electrode FGB to the side in the +Y direction. The first portion 52a includes a portion that is located closer to the side in the +Y direction than to the side of the second channel portion 61B in the −X direction. The first portion 52a has a first edge e3 adjacent to the first insulator 71 (an insulator 71A which will be described later) in the X direction.

On the other hand, the second portion 52b is formed in a circular arc shape that becomes close to the first insulator 71 in the direction from the center portion in the Y direction of the second floating gate electrode FGB to the side in the —Y direction. The second portion 52b includes a portion that is located closer to the side in the −X direction than to the side of the second channel portion 61B in the −X direction. The second portion 52b has a second edge e4 (an insulator 71B which will be described later) adjacent to the first insulator 71 in the X direction. Note that, the first portion 52a and the second portion 52b may be directly connected to each other, and a straight portion extending in the Y direction may be provided between the first portion 52a and the second portion 52b.

<2.3 Block Insulating Film>

Next, the block insulating film 41 will be described. As shown in FIG. 2, the plurality of block insulating films 41 include: first insulating films (first block insulating film) 41A located on the sides of the pillars 60 in the −X direction; and second insulating films (second block insulating film) 41B located on the sides of the pillars 60 in the +X direction. The first insulating film 41A is provided between the first word line WLA and the first floating gate electrode FGA. The second insulating film 41B is provided between the second word line WLB and the second floating gate electrode FGB. In the embodiment, both end portions of the first insulating film 41A in the Y direction are provided between the first floating gate electrode FGA and the first insulator 71 in the X direction. Both end portions of the second insulating film 41B in the Y direction are provided between the second floating gate electrode FGB and the first insulator 71 in the X direction. The block insulating film 41 is formed of, for example, a layered film having SiN and SiON, a layered film having SiO/SiN, or the like.

Each of the first insulating film 41A and the second insulating film 41B is formed of, for example, three insulating films 45, 46, and 47.

The insulating film 45 is located closest to the floating gate electrode FG in the three insulating films 45, 46, and 47. The insulating film 45 covers, for example, a lateral surface, an upper surface, and a lower surface of the floating gate electrode FG (refer to FIG. 4). The insulating film 45 also covers the sides of the first portion 51a and the second portion 51b of the floating gate electrode FG in the +X direction (refer to FIG. 2).

The insulating film 45 is formed of, for example, a high-k material such as silicon nitride (SiN), hafnium oxide (HfO), or the like. However, the insulating film 45 may be formed of a material containing ruthenium (Ru), aluminum (Al), titanium (Ti), zirconium (Zr), or silicon (Si). The insulating film 45 is an example of "first insulating film".

Most of the insulating film 46 is provided on the opposite side of the floating gate electrode FG with respect to the insulating film 45. The insulating film 46 covers a lateral surface, an upper surface, and a lower surface of the floating gate electrode FG with, for example, the insulating film 45 interposed therebetween (refer to FIG. 4). The other of the insulating film 46 covers the side of the insulating film 45 in the +X direction which covers the first portion 51a of the floating gate electrode FG (refer to FIG. 2). However, instead of the above constitution, the insulating film 46 may only cover a lateral surface of the floating gate electrode FG and may be provided along a boundary between the insulating film (interlayer insulating film) 32 and the word line WL. The insulating films 46 are formed of, for example, silicon oxide. The insulating film 46 is an example of "first insulating film".

Most of the insulating film 47 is provided on the opposite side of the floating gate electrode FG with respect to the insulating films 45 and 46. The insulating film 47 is provided along a boundary between, for example, the insulating film (interlayer insulating film) 32 and the word line WL, and covers a lateral surface of the floating gate electrode FG with the insulating films 45 and 46 interposed therebetween (refer to FIG. 4). The other of the insulating film 47 is formed between the word lines WL and an insulator 71 which will be described later (refer to FIG. 2). However, instead of the above constitution, like the insulating films 45 and 46, the insulating film 47 may cover a lateral surface, an upper surface, and a lower surface of the floating gate electrode FG. The insulating films 47 need to be formed of a material having a high dielectric constant, and are formed of, for example, a high-k film that is an oxide film containing aluminum (Al), hafnium (Hf), or zirconium (Zr). The insulating films 47 may be formed of silicon nitride.

<2.4 Semiconductor Pillar>

Figure 3:
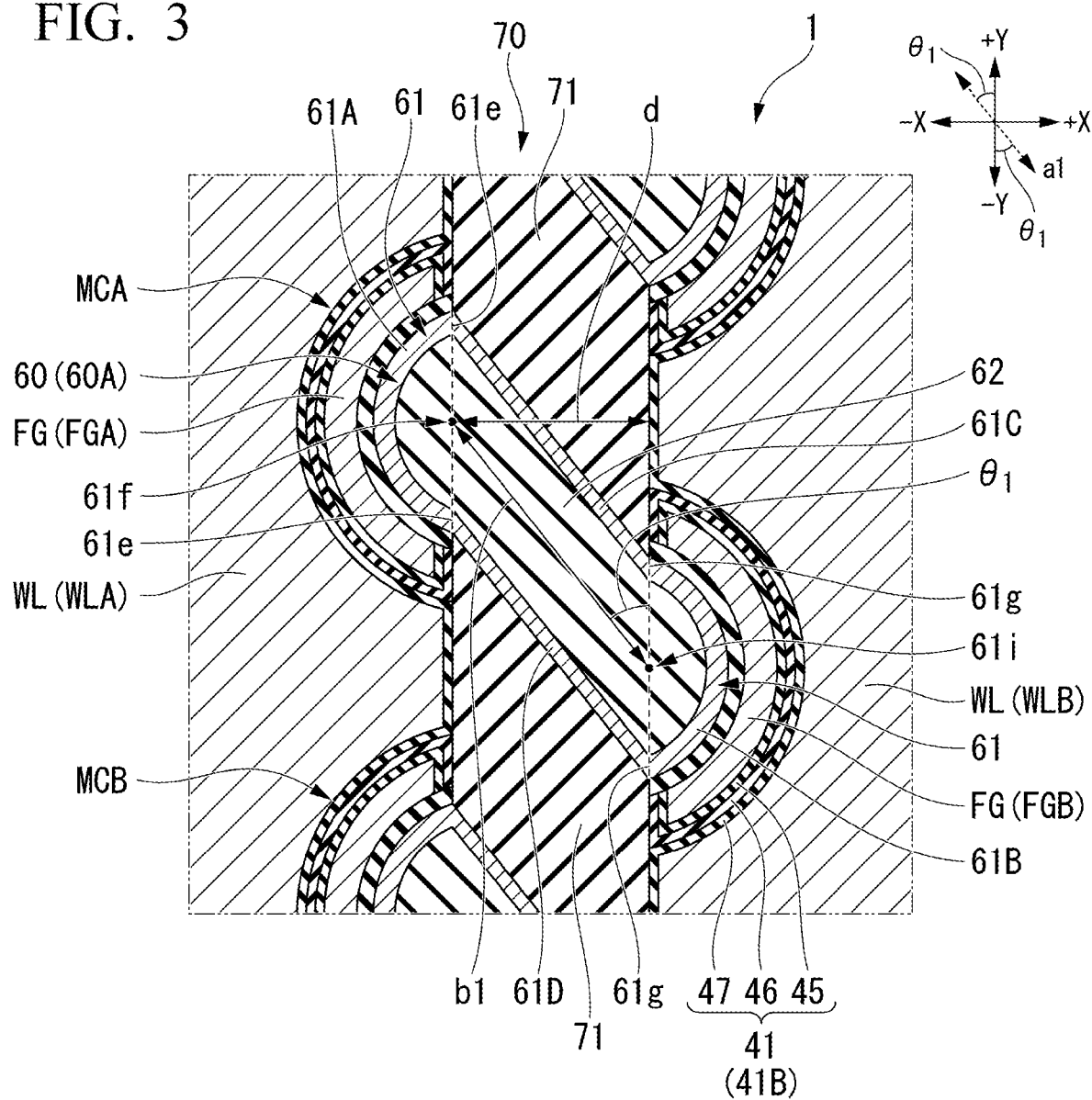
FIG. 3 is a schematic cross-sectional view showing a configuration of a cell structure, a configuration of a semiconductor pillar, and a configuration of a channel which are shown in FIG. 2, and showing a relationship of the above configurations and an inclination angle thereof.

Next, the semiconductor pillar 60 will be described. As shown in FIG. 2, the semiconductor pillars 60 are each provided between the first word line WLA and the second word line WLB. The semiconductor pillars 60 each extend in an $a_1$ direction intersecting the X direction and the Y direction as shown in FIGS. 2 and 3. The semiconductor pillar 60 includes, for example, a channel 61, a core insulator 62 (second insulator), and a tunnel insulating film (third insulating film) 63.

In the embodiment, recesses WLAD are formed on the side of the first word line WLA in the +X direction at a predetermined distance in the Y direction. The insulating films 45, 46, and 47, the floating gate electrodes FGA, and the first tunnel insulating films (third-insulating-film first portion) 63A are formed such that the recesses WLAD are filled therewith. The first channel portion 61A and a core insulating end 62A located at the side of the semiconductor pillar 60 in the −X direction are formed so as to be located inside the first tunnel insulating film 63A. In other words, the core insulating end 62A is an end of the core insulator 62 (second insulator) in the −X direction.

On the other hand, in a cross section shown in FIG. 2, recesses WLBD are formed on the side of the second word line WLB in the −X direction at a predetermined distance in the Y direction. The insulating films 45, 46, and 47, the floating gate electrodes FGB, and the second tunnel insulating films (third-insulating-film second portion) 63B are formed such that the recesses WLBD are filled therewith. The second channel portion 61B and a core insulating end 62B located at the side of the semiconductor pillar 60 in the +X direction are formed so as to be located inside the second tunnel insulating film 63B. In other words, the core insulating end 62B is an end of the core insulator 62 (second insulator) in the +X direction.

In the embodiment, a distance which the recesses WLAD formed along the first word line WLA are formed is equal to a distance which the recesses WLBD formed along the second word line WLA are formed. Furthermore, a central position between the two recesses WLAD formed along the first word line WLA and a central position of the recess WLBD that is located at the side in the +X direction with respect to the above central position and is formed along the second word line WLB are arranged side by side in the X direction.

In other words, in the semiconductor storage device 1 shown in FIG. 2, the plurality of semiconductor pillars 60 and the plurality of first insulators are alternately disposed in the Y direction, the semiconductor storage device includes: a plurality of first memory cell structures and a plurality of second memory cell structures. Each of the first memory cell structures includes the first word line WLA, the first floating gate electrode FGA, and the semiconductor pillar 60. Each of the second memory cell structures includes the second word line WLB, the second floating gate electrode FGB, and the semiconductor pillar 60. The first memory cell structures and the second memory cell structures are disposed such that positions at which the first memory cell structures are not formed overlap the second memory cell structures in the X direction.

Accordingly, as shown in cross section of FIG. 2, the recesses WLAD formed along the first word line WLA and the recesses WLBD formed along the second word line WLB are alternately arranged in a zig-zag manner in the Y direction.

The semiconductor pillar 60 has a region which includes the core insulator 62 and the channel 61 surrounding the periphery of the core insulator 62. The region is formed in a substantially oval shape that extends straight in a diagonal direction (direction $a_1$) inclined with respect to the X direction shown in FIG. 2 at an inclination angle θ. In cross section of FIG. 2, the channel 61 surrounding the core insulator 62 having an oval shape includes: the first channel portion 61A formed in the recess WLAD; and the second channel portion 61B formed in the recess WLBD. The end in the +Y direction of the both end portions of the first channel portion 61A in the Y direction is connected to the end of the second channel portion 61B in the +Y direction via a connection channel portion 61C extending in the $a_1$ direction between the recess WLAD and the recess WLBD.

The end in the —Y direction of the both end portions of the first channel portion 61A in the Y direction is connected to the end of the second channel portion 61B in the —Y direction via a connection channel portion 61D extending in the $a_1$ direction between the recess WLAD and the recess WLBD. That is, the channel 61 includes the first channel portion 61A, the second channel portion 61B, and the connection channel portions 61C and 61D disposed around the core insulator 62. The first channel portion 61A is provided between the first electrode and the core insulator 62. The second channel portion 61B is provided between the second electrode and the core insulator 62. The first channel portion 61A and the second channel portion 61B are connected via the connection channel portions 61C and 61D to surround the core insulator 62.

A first cell structure MCA (first memory cell structure) which will be described later is formed to include: a third insulating film 63 (third-insulating-film first portion 63A) disposed at the end of the channel 61 in the −X direction; the floating gate electrode FGA; the insulating films 45, 46, and 47; the word lines WLA, or the like. A second cell structure MCB (second memory cell structure) which will be described later is formed to include: the third insulating film 63 (third-insulating-film second portion 63B) disposed at the end of the channel 61 in the +X direction; the floating gate electrode FGB; the insulating films 45, 46, and 47; the word lines WLB, or the like.

The channel 61 extends in the Z direction over an entire length (a whole height) of the semiconductor pillar 60 in the Z direction. A lower end of the channel 61 passes through the upper insulating film 23 of the lower structure 20, and is connected to the source line SL. On the other hand, an upper end of the channel 61 is connected to the bit line BL via the contact 91. The channel 61 is formed of a semiconductor material such as amorphous silicon (a-Si). However, the channel 61 may be formed of, for example, polysilicon into a part of which impurities are doped. The impurities included in the channel 61 are any one selected from the group consisting of, for example, carbon, phosphorus, boron, and germanium. For example, in a case where the channel 61 injects electrons into the floating gate electrode FG, takes the electrons injected into the floating gate electrode FG from the floating gate electrode FG, or the like, an electric current flows between the source line SL and the bit line BL.

In the embodiment, as shown in FIG. 2, the channel 61 is formed in an oval and ring shape that extends in the $a_1$ direction between the first word line WLA and the second word line WLB. In the channel 61, the first channel portion 61A and the second channel portion 61B are adjacent to one another in the diagonal direction with respect to the X direction and each extend in the Z direction.

The core insulator 62 is provided on a central side of the semiconductor pillar 60 relative to the channel 61 in the X and Y directions. For example, the core insulator 62 is provided on an inner circumferential surface of the channel 61. The core insulator 62 extends in the Z direction over an entire length (a whole height) of the semiconductor pillar 60 in the Z direction. The core insulator 62 is formed of, for example, silicon oxide (SiO).

The tunnel insulating film (third insulating film) 63 includes: the first tunnel insulating film 63A located on the side of the semiconductor pillar 60 in the −X direction; and the second tunnel insulating film 63B located on the side of the semiconductor pillar 60 in the +X direction. The first tunnel insulating film 63A is provided along at least a lateral surface of the first channel portion 61A in the −X direction.

The first tunnel insulating film 63A is provided between the first floating gate electrode FGA and the first channel portion 61A. The second tunnel insulating film 63B is provided along at least a lateral surface of the second channel portion 61B in the +X direction. The second tunnel insulating film 63B is provided between the second floating gate electrode FGB and the second channel portion 61B.

In the embodiment, the first tunnel insulating film 63A is formed in a semicircular shape that surrounds a lateral surface of the first channel portion 61A in the −X direction, a lateral surface of the first channel portion 61A in the —Y direction, and a lateral surface of the first channel portion 61A in the +Y direction. The first tunnel insulating film 63A extends, for example, in the Z direction over an entire length (a whole height) of the semiconductor pillar 60 in the Z direction. The second tunnel insulating film 63B is formed in a semicircular shape that surrounds a lateral surface of the second channel portion 61B in the +X direction, a lateral surface of the second channel portion 61B in the —Y direction, and a lateral surface of the second channel portion 61B in the +Y direction. The second tunnel insulating film 63B extends, for example, in the Z direction over an entire length (a whole height) of the semiconductor pillar 60 in the Z direction.

In the configuration shown in FIG. 2, the first cell structure MCA that can store electric charge at the periphery of the first semiconductor pillar 60A is formed by the first floating gate electrode FGA, the second floating gate electrode FGB, the first insulating film 41A, the second insulating film 41B, the first tunnel insulating film 63A, and the second tunnel insulating film 63B which correspond to the first semiconductor pillar 60A.

Similarly, the second cell structure MCB that can store electric charge at the periphery of the second semiconductor pillar 60B is formed by the first floating gate electrode FGA, the second floating gate electrode FGB, the first insulating film 41A, the second insulating film 41B, the first tunnel insulating film 63A, and the second tunnel insulating film 63B which correspond to the second semiconductor pillar 60B. The second cell structure MCB and the first cell structure MCA are adjacent to one another in the —Y direction.

In the first cell structure MCA, both ends in the Y direction of the first channel portion 61A that is formed on the side in the −X direction shown in FIG. 2 and has a circular arc shape are defined as both end portions 61e of the first channel portion 61A, and a midpoint (middle point) between both the end portions 61e and 61e is supposed to be a first midpoint 61f.

In the first cell structure MCA, both ends in the Y direction of the second channel portion 61B that is formed on the side in the +X direction shown in FIG. 2 and has a circular arc shape are defined as both end portions 61g of the second channel portion 61B, and a midpoint (middle point) between the both end portions 61g and 61g is supposed to be a second midpoint 61i.

In the above supposition, it is possible to explain that the configuration shown in FIG. 2 is a configuration in which a center line b connecting the first midpoint 61f and the second midpoint 61i is inclined with respect to the Y direction at an optional inclination angle $\theta_1$ (approximately 45° in FIG. 2). That is, the channel 61 extends in the direction $a_1$ intersecting the Y direction at the inclination angle $\theta_1$.

The inclination angle $\theta_1$ of the center line b with respect to the Y direction is preferably in the range of 30 to 80° and is more preferably in the range of 30 to 85°. As the inclination angle, other angles such as 30°, 60°, or the like can be adopted.

In other words, FIG. 2 shows the cross section that intersects with the Z direction (first direction) and includes the first word line (first interconnection) WLA, the floating gate electrode FGA (first electrode), the semiconductor pillar 60, the floating gate electrode FGB (second electrode), and the second word line (second interconnection) WLB. In FIG. 2, both the end portions 61e and 61e extend in the Y direction (second direction) of the first channel portion 61A, and an intermediate position between both the end portions 61e and 61e is defined as the first midpoint 61f. In FIG. 2, the both end portions 61g and 61g extend in the Y direction (second direction) of the second channel portion 61B, and an intermediate position between the both end portions 61g and 61g is defined as the second midpoint 61i. Consequently, the center line bi connecting the first midpoint 61f and the second midpoint 61i is inclined with respect to the Y direction (second direction) at the aforementioned inclination angle.

In one viewpoint, the floating gate electrodes FGA and FGB corresponding to the second semiconductor pillar 60B are examples of "third charge storage part" and "fourth charge storage part", respectively. The tunnel insulating films 63A and 63B corresponding to the second semiconductor pillar 60B are examples of "third tunnel insulating film" and "fourth tunnel insulating film", respectively.

<2.5 Insulating-Dividing Portion>

Subsequently, the insulating-dividing portion 70 will be described. As shown in FIG. 2, the insulating-dividing portion 70 is provided in the laminate 30 and divides the first word line WLA from the second word line WLB.

<2.5.1 First Insulator>

The first insulator 71 will be described. As shown in FIGS. 2 and 3, the first insulators 71 are each provided between the plurality of semiconductor pillars 60 in the Y direction, and each extend in the Y direction between the plurality of semiconductor pillars 60. The first insulators 71 are provided between the first word line WLA and the second word line WLB in the X direction, and each divide the first word line WLA from the second word line WLB. Furthermore, the first insulators 71 are provided between the first floating gate electrode FGA and the second floating gate electrode FGB in the X direction, and each divide the first floating gate electrode FGA from the second floating gate electrode FGB. The first insulator 71 that divides the first floating gate electrode FGA from the second floating gate electrode FGB is formed in a substantially parallelogram shape when seen in a cross-sectional view shown in FIG. 2. The thickness of the first insulator 71 in the X direction is represented by reference letter "d" in FIG. 3.

For details, the first insulator 71 has, for example, a first portion 71a, a second portion 71b, and a third portion 71c which are each formed in a parallelogram shape in a cross section shown in FIG. 2.

As shown in FIG. 2, the first portion 71a is provided between the portion of the second block insulating film 46 on the side in the —Y direction on the side of the first cell structure MCA in the -X direction and the portion of the second block insulating film 46 on the side in the —Y direction on the side of the first cell structure MCA in the +X direction and extends in the direction $a_1$.

The second portion 71b is provided between the portion of the second block insulating film 46 on the side in the +Y direction on the side of the second cell structure MCB in the -X direction and the portion of the second block insulating film 46 on the side in the +Y direction on the side of the second cell structure MCB in the +X direction and extends in the direction $a_1$.

The third portion 71c extends between the first portion 71a and the second portion 71b in the Y direction and is a portion that connects the first portion 71a and the second portion 71b. In other words, out of the side of the connection channel portion 61D in the +Y direction and the side of the connection channel portion 61D in the —Y direction, the portion facing the side of the connection channel portion 61D in the —Y direction is the first portion 71a (first region), and the portion facing the side of the connection channel portion 61D in the +Y direction is the second portion 71b (second region). The third portion 71c (third region) is located between the first portion 71a and the second portion 71b. The three portions, i.e., the first portion 71a, the second portion 71b, and the third portion 71c are not portions which are connected to each other to have a boundary, and are portions which are continuously integrated. The names and reference letters of the three portion are defined for convenience of explanation of the embodiment. The first insulator 71 is in cooperation with the semiconductor pillar 60, and electrically insulates the first floating gate electrode FGA from the second floating gate electrode FGB.

The first insulator 71 extends in the Z direction over an entire length (a whole height) of the semiconductor pillar 60 in the Z direction.

As shown in FIG. 2, the semiconductor pillars 60 and the first insulators 71 are alternately provided in the Y direction. In other words, the first insulators 71 are separately provided at both sides of the semiconductor pillar 60 in the Y direction.

The first insulator 71 is in cooperation with the semiconductor pillar 60, and electrically insulates the first word line WLA from the second word line WLB. In the embodiment, the first insulators 71 each extend straight in the Y direction between the tunnel insulating film 63 of the first cell structure MCA and the tunnel insulating film 63 of the second cell structure MCB, and are each in contact with the connection channel portion 61D of the first cell structure MCA and the connection channel portion 61C of the second cell structure MCB. The first insulator 71 is formed of, for example, an insulation material such as silicon oxide ($SiO_2$).

<Advantage>

As shown in cross sections of FIGS. 2 and 3, the semiconductor storage device 1 according to the embodiment includes the semiconductor pillars 60, each of which extends in the direction $a_1$. The semiconductor storage device 1 according to the embodiment includes the memory cell structures MCA and MCB, each of which causes the floating gate electrodes FG obliquely opposed to each other in the direction $a_1$ to face each other with the channel 61 interposed therebetween. Here, the semiconductor storage device 1 according to the embodiment does not have a configuration in which the floating gate electrodes that sandwich the insulator 71 therebetween and are opposed to each other in the X direction face each other with a channel interposed therebetween.

In the memory cell structure in which the floating gate electrodes that sandwich the insulator 71 therebetween and are opposed to each other in the X direction face each other with a channel interposed therebetween, parasitic capacitance is generated between cells facing each other in a miniaturized semiconductor storage device. Interference between the opposed cells significantly depends on the parasitic capacitance between the opposed cells. Accordingly, in the memory cell structures MCA and MCB in which the floating gate electrodes FG obliquely opposed to each other in the direction $a_1$ face each other with the channel 61 interposed therebetween, interference between the opposed cells becomes low. When interference between the opposed cells is high, there is a problem in that a threshold value at writing fluctuates. Consequently, the configuration according to the embodiment can eliminate the fluctuation of a threshold value at writing and has the characteristics that stabilized writing operation can be achieved.

The semiconductor storage device 1 according to the embodiment including the channel 61 extending in the direction $a_1$ can reduce capacity of the channel to be less than that of a semiconductor storage device including a channel extending in the X direction.

Additionally, since the configuration shown in FIG. 2 is a configuration that can concentrate an electric field in the end of the channel 61, reaction at writing can be speeded up. Accordingly, the semiconductor storage device 1 according to the embodiment can reduce a write voltage and can reduce consumed power.

Second Embodiment

Next, a second embodiment will be described. In the second embodiment, as shown in cross section of FIG. 6, an inclination angle of a direction $a_2$ in which the semiconductor pillar 60 extends with respect to the Y direction is different from the inclination angle of the direction $a_1$ in which the semiconductor pillar 60 according to the first embodiment shown in cross section of FIG. 2 extends. Note that, the configuration except to the following explanation is the same as that of the first embodiment.

Figure 6:
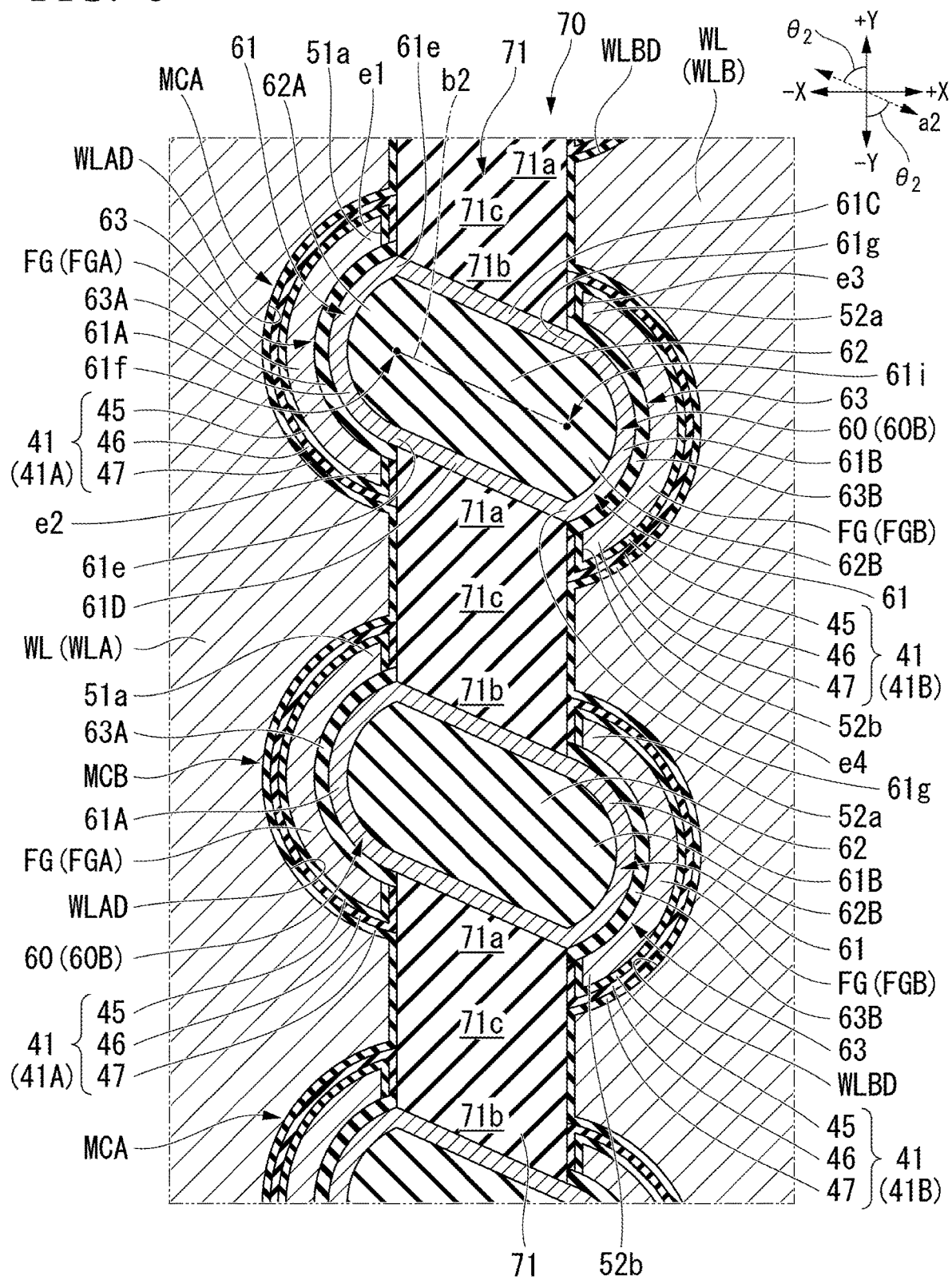
FIG. 6 is a cross-sectional view showing part of a semiconductor storage device according to a second embodiment.

FIG. 6 is a cross-sectional view showing part of a semiconductor storage device 1 according to the second embodiment.

In the first cell structure MCA according to the second embodiment, both ends in the Y direction of the first channel portion 61A that is formed on the side in the −X direction shown in FIG. 6 and has a circular arc shape are defined as both end portions 61e of the first channel portion 61A, and a midpoint (middle point) between both the end portions 61e and 61e is supposed to be a first midpoint 61f.

In the first cell structure MCA, both ends in the Y direction of the second channel portion 61B that is formed on the side in the +X direction shown in FIG. 6 and has a circular arc shape are defined as both end portions 61g of the second channel portion 61B, and a midpoint (middle point) between the both end portions 61g and 61g is supposed to be a second midpoint 61i.

In the above supposition, it is possible to explain that the configuration shown in FIG. 6 is a configuration in which a center line b connecting the first midpoint 61f and the second midpoint 61i is inclined with respect to the Y direction at an inclination angle $\theta_2$.

The inclination angle $\theta_2$ of the center line b with respect to the Y direction is larger than the angle of 45° that is adopted in the first embodiment.

As shown in cross section of FIG. 6, the semiconductor storage device according to the second embodiment includes the semiconductor pillar 60 extending in the direction $a_2$.

In the memory cell structure in which the floating gate electrodes that sandwich the insulator 71 therebetween and are opposed to each other in the X direction are connected to each other by a channel, parasitic capacitance is generated between cells facing each other in a miniaturized semiconductor storage device. Interference between the opposed cells significantly depends on the parasitic capacitance between the opposed cells. Accordingly, in the memory cell structures MCA and MCB in which the floating gate electrodes FG obliquely opposed to each other in the direction $a_2$ are connected to each other by the channel 61, interference between the opposed cells becomes low.

When interference between the opposed cells is high, there is a problem in that a threshold value at writing fluctuates. Consequently, the configuration according to the embodiment can eliminate the fluctuation of a threshold value at writing and has the characteristics that stabilized writing operation can be achieved.

The semiconductor storage device 1 according to the embodiment including the channel 61 extending in the direction $a_2$ can reduce capacity of the channel to be less than that of a semiconductor storage device including a channel extending in the X direction.

Additionally, since the configuration shown in FIG. 6 is a configuration that can concentrate an electric field in the end of the channel 61, reaction at writing can be speeded up. Accordingly, the semiconductor storage device 1 according to the second embodiment can reduce a write voltage and can reduce consumed power.

Third Embodiment

Next, a third embodiment will be described.

Figure 7:
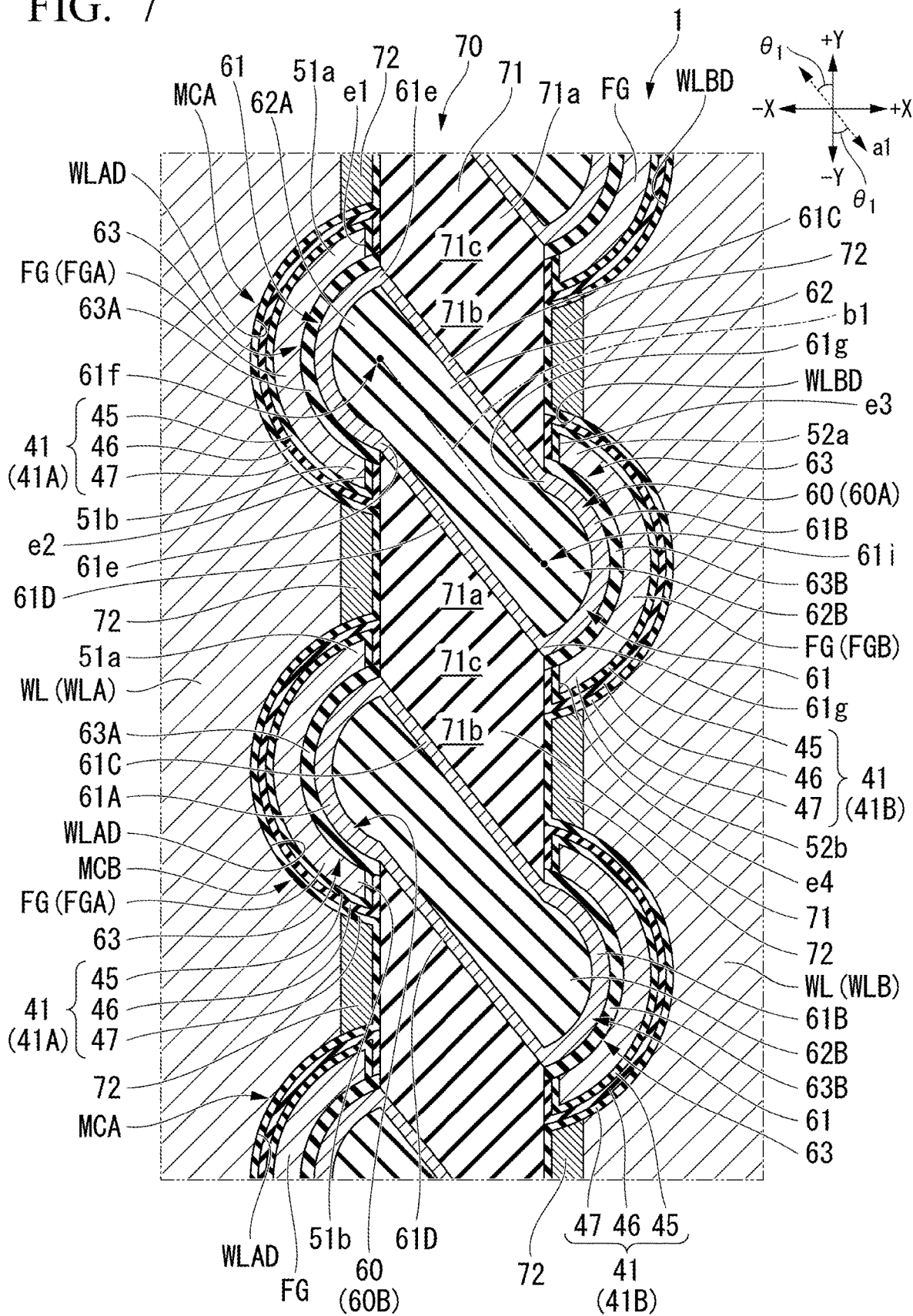
FIG. 7 is a cross-sectional view showing part of a semiconductor storage device according to a third embodiment.

In the third embodiment, as shown in cross section of FIG. 7, a direction in which the semiconductor pillar 60 extends is the same as the direction in which the semiconductor pillar 60 according to the first embodiment shown in cross section of FIG. 2 extends. The third embodiment has the characteristics that a third insulator 72 is provided between the first word line WLA and the insulator 71 and that the third insulator 72 is provided between the second word line WLB and the insulator 71. Note that, the configuration except to the point in which the third insulator 72 is provided is the same as that of the first embodiment.

FIG. 7 is a cross-sectional view showing part of a semiconductor storage device 1 according to the third embodiment.

In the first cell structure MCA according to the third embodiment, the first cell structures MCA and the second cell structures MCB which are spaced apart at a predetermined distance in the Y direction are alternately arranged. The third insulators 72 are formed between the first cell structure MCA and the second cell structure MCB and between the first word line WLA and the insulator 71. For details, the third insulator 72 is formed between the first word line WLA and the insulating film 47 that is formed along the insulator 71 between the first cell structure MCA and the second cell structure MCB. The film thickness of the third insulator 72 in the X direction is larger than the total film thickness of the three insulating films 45 to 47. The third insulator 72 is formed of silicon oxide ($SiO_2$) or the like and is formed of a material having relative permittivity lower than that of silicon nitride.

In the semiconductor storage device 1 having the configuration shown in FIG. 7, in a case of carrying out writing of the floating gate electrode FG from the word line WL, it is conceivable that an electric field from the word line WL is concentrated in the first portion 51a and the second portion 51b which are the both ends of the floating gate electrode FG in the Y direction. Here, in the semiconductor storage device 1 having a miniaturized configuration, when leakage current flows due to electric field concentration in the both ends of the floating gate electrode FG in the Y direction, a percentage of constraining the characteristics of the cell structure due to leakage current increases. In some cases, transfer of electric charge occurs at an unnecessary position, and writing characteristics is likely to be saturated.

In contrast, according to the configuration shown in FIG. 7, the third insulators 72 are disposed between the word line WL and the first portion 51a which is one of the both ends of the floating gate electrode FG in the Y direction and between the word line WL and the second portion 51b which is the other of the both ends of the floating gate electrode FG in the Y direction. Accordingly, it is possible to reduce leakage current at the both ends of the floating gate electrode FG in the Y direction. Therefore, in the configuration shown in FIG. 7, it is possible to provide the semiconductor storage device 1 having excellent writing characteristics.

Fourth Embodiment

Next, a fourth embodiment will be described.

Figure 8:
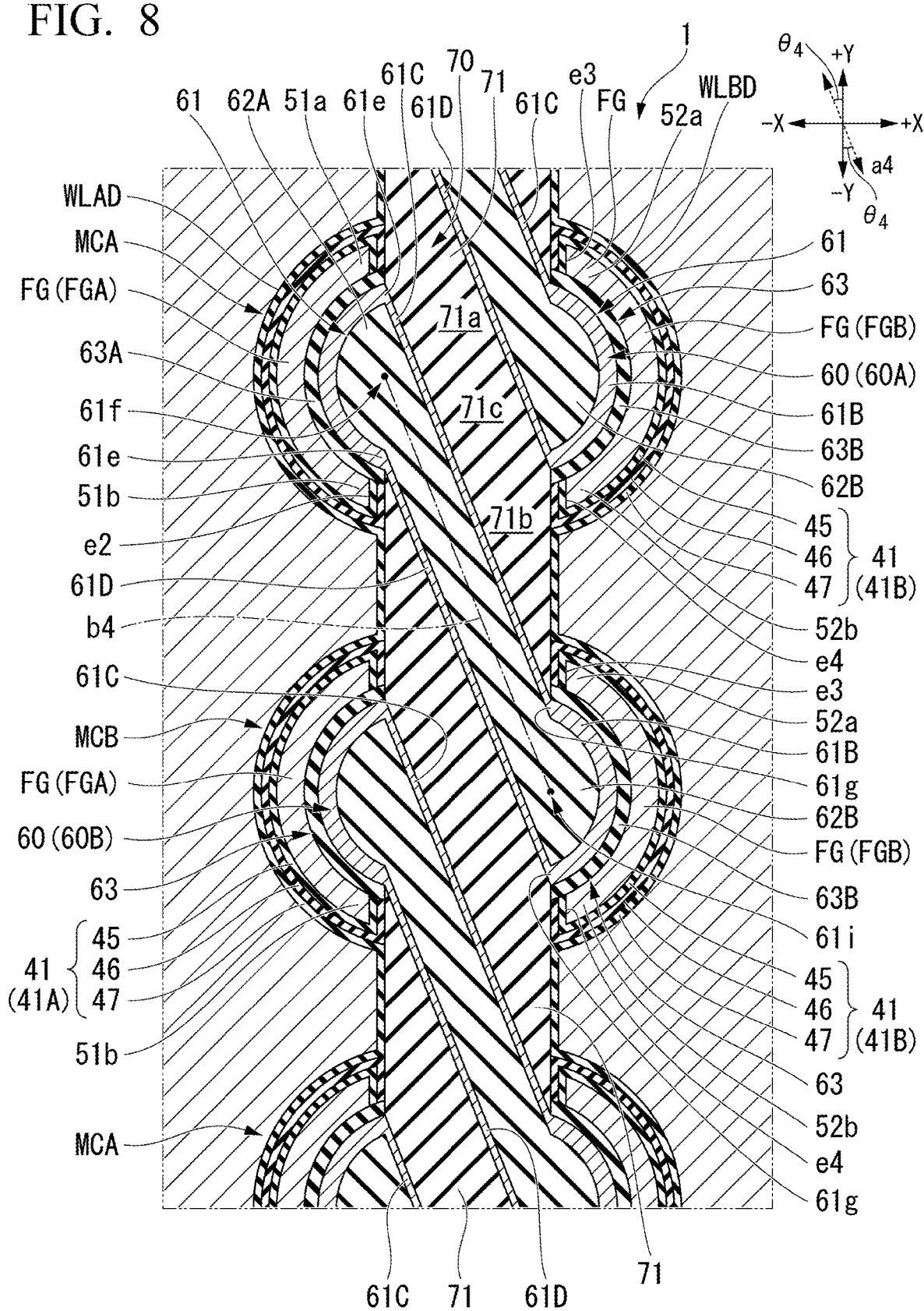
FIG. 8 is a cross-sectional view showing part of a semiconductor storage device according to a fourth embodiment.

In the fourth embodiment, as shown in cross section of FIG. 8, an inclination angle of a direction in which the semiconductor pillar 60 extends with respect to the Y direction is different from the inclination angle of the direction in which the semiconductor pillar 60 according to the first embodiment shown in cross section of FIG. 2 extends. Note that, the configuration except to the following explanation is the same as that of the first embodiment.

FIG. 8 is a cross-sectional view showing part of a semiconductor storage device 1 according to the fourth embodiment.

In the first cell structure MCA according to the fourth embodiment, both ends in the Y direction of the first channel portion 61A that is formed on the side in the –X direction shown in FIG. 8 and has a circular arc shape are defined as both end portions 61e of the first channel portion 61A, and a midpoint (middle point) between both the end portions 61e and 61e is supposed to be a first midpoint 61f.

In the first cell structure MCA, both ends in the Y direction of the second channel portion 61B that is formed on the side in the +X direction shown in FIG. 8 and has a circular arc shape are defined as both end portions 61g of the second channel portion 61B, and a midpoint (middle point) between the both end portions 61g and 61g is supposed to be a second midpoint 61i.

In the above supposition, it is possible to explain that the configuration shown in FIG. 8 is a configuration in which a center line b connecting the first midpoint 61f and the second midpoint 61i is inclined with respect to the Y direction at an inclination angle $\theta_4$.

The inclination angle $\theta_4$ of the center line b with respect to the Y direction is smaller than the angle of 45° that is adopted in the first embodiment, for example, the inclination angle $\theta_4$ is approximately 20° in the configuration shown in FIG. 8.

Furthermore, in the cell structures that are arranged between the first word line WLA and the second word line WLB in the Y direction, the first channel portion 61A and the second channel portion 61B which face each other in the X direction do not face each other with the connection channel portions 61C and 61D interposed therebetween. In the configuration shown in FIG. 8, the first channel portion 61A is not connected to the second channel portion 61B that is disposed to face the first channel portion 61A in the X direction. The first channel portion 61A is connected via the connection channel portions 61C and 61D to the second channel portion 61B that is next to the second channel portion 61B disposed to face the first channel portion 61A in the —Y direction.

That is, the cell structures are provided on both sides of the insulator 71 in the thickness direction along the X direction (third direction). However, the channel 61 of the cell structure including the first floating gate electrode FGA (first electrode) is not connected to the channel 61 of the cell structure including the second floating gate electrode FGB (second electrode) that is closest to the first floating gate electrode FGA in the X direction. Consequently, in a direction $a_4$ shown in FIG. 8, the channel 61 of the cell structure including the first floating gate electrode FGA (first electrode) faces the channel 61 of the cell structure including the second floating gate electrode FGB (second electrode) that is next to the closest the second floating gate electrode FGB (located at the position in the —Y direction) in the Y direction (second direction).

As shown in cross section of FIG. 8, the semiconductor storage device according to the fourth embodiment includes the semiconductor pillar 60 having the channel 61 extending in the direction $a_4$.

In the memory cell structure in which the floating gate electrodes that sandwich the insulator 71 therebetween and are opposed to each other in the X direction face each other with a channel interposed therebetween, parasitic capacitance is generated between cells facing each other in a miniaturized semiconductor storage device. Interference between the opposed cells significantly depends on the parasitic capacitance between the opposed cells. Accordingly, in the memory cell structures MCA and MCB in which the floating gate electrodes FG obliquely opposed to each other in the direction $a_4$ face each other with the channel 61 interposed therebetween, interference between the opposed cells becomes low. When interference between the opposed cells is high, there is a problem in that a threshold value at writing fluctuates. Consequently, the configuration according to the embodiment can eliminate the fluctuation of a threshold value at writing and has the characteristics that stabilized writing operation can be achieved.

According to the configuration shown in FIG. 8, the first channel portion 61A is not connected to the second channel portion 61B disposed so as to face the first channel portion 61A in the X direction but is connected to the other second channel portion 61B that is separated by one in the —Y direction.

In the case of carrying out writing of the floating gate electrode FG from the word line WL in this configuration, it is conceivable that an electric field from the word line WL is concentrated in the first portion 51a and the second portion 51b which are the both ends of the floating gate electrode FG in the Y direction. Here, in the semiconductor storage device 1 having a miniaturized configuration, when leakage current flows due to electric field concentration in the both ends of the floating gate electrode FG in the Y direction, a percentage of constraining the characteristics of the cell structure due to leakage current increases. In some cases, transfer of electric charge occurs at an unnecessary position, and writing characteristics is likely to be saturated.

In the case where the leakage current is concerned, it is preferable to reduce the leakage current by applying the configuration in which the third insulator 72 shown in FIG. 7 is arranged to the configuration shown in FIG. 8.

Although a plurality of embodiments and modifications have been described above, the embodiments are not limited to the above examples. For example, the above-described two or more embodiments and modifications may be realized in combination with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of semiconductor pillars extending in a first direction and being spaced apart at a distance in a second direction intersecting the first direction with a first insulator interposed therebetween, each of which includes a channel;
a first interconnection extending in the second direction and facing each semiconductor pillar;
a second interconnection extending in the second direction, facing each semiconductor pillar and being spaced apart from the first interconnection at a distance in a third direction intersecting the first direction and the second direction;
a first electrode between the channel and the first interconnection;
a second electrode between the channel and the second interconnection;
a first insulating film between the first electrode and the first interconnection; and
a second insulating film between the second electrode and the second interconnection, wherein
the semiconductor pillar includes a second insulator,
the channel includes: a first channel portion between the first electrode and the second insulator; a second channel portion between the second electrode and the second insulator; and a connection channel portion around the second insulator,
the first channel portion and the second channel portion are connected via the connection channel portion to surround the second insulator,
when a virtual cross section intersecting the first direction and including the first interconnection, the first electrode, the semiconductor pillar, the second electrode, and the second interconnection is determined,
both first end portions of the first channel portion and a first midpoint between both the first end portions are determined in the virtual cross section, both second end portions of the second channel portion and a second midpoint between both the second end portions are determined in the virtual cross section, and an angle between the second direction and a center line connecting the first midpoint and the second midpoint is an acute angle.

2. The semiconductor storage device according to claim 1, wherein
the angle is in a range of 30° to 80°.

3. The semiconductor storage device according to claim 1, further comprising:
a third insulating film between the first channel portion and the first electrode and between the second channel portion the second electrode.

4. The semiconductor storage device according to claim 1, wherein
the semiconductor pillars and the first insulators are alternately disposed in the second direction,
the semiconductor storage device includes: a plurality of first memory cell structures, each of which includes the first interconnection, the first electrode, and the semiconductor pillar; and a plurality of second memory cell structures, each of which includes the second interconnection, the second electrode, and the semiconductor pillar, and
the first memory cell structures and the second memory cell structures are disposed such that positions at which the first memory cell structures are not formed overlap the second memory cell structures in the third direction.

5. The semiconductor storage device according to claim 1, wherein
the semiconductor pillars and the first insulators are alternately disposed in the second direction,
the semiconductor storage device includes: a plurality of first memory cell structures, each of which includes the first interconnection, the first electrode, and the semiconductor pillar; and a plurality of second memory cell structures, each of which includes the second interconnection, the second electrode, and the semiconductor pillar, and
the first memory cell structures and the second memory cell structures are disposed at a predetermined distance in the second direction.

6. The semiconductor storage device according to claim 1, wherein
the semiconductor pillars and the first insulators are alternately disposed in the second direction,
the semiconductor storage device includes: a plurality of first memory cell structures, each of which includes the first interconnection, the first electrode, and the semiconductor pillar; and a plurality of second memory cell structures, each of which includes the second interconnection, the second electrode, and the semiconductor pillar,
the first memory cell structures and the second memory cell structures are disposed at a predetermined distance in the second direction,
in the first memory cell structures and the second memory cell structures which are provided on both sides of the first insulator in a thickness direction along the third direction,
the first channel portion of the first memory cell structure including the first electrode is not connected to the second channel portion of the second memory cell structure including the second electrode that is closest to the first channel portion, and
the first channel portion of the first memory cell structure including the first electrode is connected to the second channel portion of the second memory cell structure including the second electrode that is next to the closest second electrode in the second direction.

* * * * *